United States Patent [19]

Wendell

[11] Patent Number: 5,883,841
[45] Date of Patent: Mar. 16, 1999

[54] SELECTIVE BIT LINE RECOVERY IN A MEMORY ARRAY

[75] Inventor: Dennis L. Wendell, Pleasanton, Calif.

[73] Assignee: Advanced Micro Devices, Inc., Sunnyvale, Calif.

[21] Appl. No.: 938,292

[22] Filed: Sep. 26, 1997

[51] Int. Cl.$^6$ ........................................................ G11C 7/00
[52] U.S. Cl. ............................................ 365/190; 365/203
[58] Field of Search .................................... 365/190, 203, 365/202, 222, 194, 230.03

[56] References Cited

U.S. PATENT DOCUMENTS

| | | | |
|---|---|---|---|
| 5,229,967 | 7/1993 | Nogle et al. | 365/208 |
| 5,268,863 | 12/1993 | Bader et al. | 365/189.01 |
| 5,349,560 | 9/1994 | Suh et al. | 365/203 |
| 5,400,285 | 3/1995 | Sakata | 365/205 |
| 5,475,635 | 12/1995 | Nogle | 365/189.02 |
| 5,490,111 | 2/1996 | Sakata | 365/189.01 |
| 5,491,655 | 2/1996 | Hirose et al. | 365/177 |
| 5,544,105 | 8/1996 | Hirose et al. | 365/189.11 |
| 5,629,900 | 5/1997 | Hirose et al. | 365/230.03 |

OTHER PUBLICATIONS

*Digital Integrated Circuits: A Design Perspective*, Jan M. Rabaey, (1996) Chapter 10, pp. 578–585.
*Digital Integrated Circuits: A Design Perspective*, Jan M. Rabaey, (1996) Chapter 4, pp. 202–209.
*Basic VLSI Design Systems and Circuits, 2nd Ed.*, Douglas A. Pucknell and Kamran Eshraghian, (1988) Chapter 10, pp. 203–218.
"An X86 Microprocessor with Multimedia Extension", Draper et al., 1997 IEEE International Solid–State Circuits Conference, Feb. 1997.

*Primary Examiner*—David Nelms
*Assistant Examiner*—Hien Nguyen
*Attorney, Agent, or Firm*—Skjerven, Morrill, MacPherson, Franklin, & Friel, L.L.P.

[57] ABSTRACT

A selective recovery circuit and method for a memory array allows bit line recovery after a write operation on a selective basis so that only those column circuits actually written are recovered to at least non-write voltage levels. For each column circuit within the memory array, a recovery signal generation circuit is provided to determine whether the column circuit was actually written and to generate a recovery signal if the column circuit was written. Each column circuit includes a recovery circuit coupled to the bit line pair which, in response to the recovery signal, restores the voltage level of the bit lines of the column circuit back to an at least non-write voltage level. Other columns which are not actually written by the write operation include those not selected by the column decode circuitry, as well as those selected by the column decode circuitry but which correspond to a non-enabled byte of the data word. The recovery circuit for these non-written column circuits is not activated after the write operation, which results in a substantial savings in power. In one embodiment, the voltage levels of the bit lines are sensed to determine whether the column circuit was written, and the recovery signal is initiated upon deactivation of a signal controlling the write operation. The recovery signal may be coupled to an equilibrate transistor as well, which equilibrates the bit lines after a write operation. The invention is particularly well-suited to use within a static RAM-based cache memory array for a processor having byte enable capability, such as an X86-compatible processor.

49 Claims, 6 Drawing Sheets

SELECTIVE BIT LINE RECOVERY IN A MEMORY ARRAY

BACKGROUND OF THE INVENTION

1. Field of the Invention

The present invention relates to memory arrays for usage in circuits including microprocessors. More specifically, the invention relates to the recovery of bit lines in a memory array after a write operation.

2. Description of the Related Art

Today's computer systems and other electronic devices utilize memory arrays to store data. Some examples of memory arrays are data caches and instruction caches on an integrated processor chip such as the K6 processor manufactured by ADVANCED MICRO DEVICES, INC. of Sunnyvale, Calif. Most memory arrays utilize a two bus or bit lines per bit arrangement to write and read data stored in a memory cell electrically coupled to the bit line pair. Typically, to write a logical one or logical zero to a memory cell, one of the two bit lines is driven to a low voltage level during the write operation. The specific bit line of the two bit lines driven low during a write operation determines whether a logical one or logical zero is stored in the memory cell during the write operation.

To read a memory cell to determine whether a logical one or logical zero is stored, a word line electrically coupled to each memory cell in a row of cells is activated or driven high to cause one of the bit lines to dip in voltage. Which bit line of the pair that dips in voltage depends on whether a logical one or a logical zero is stored in the memory cell. Each bit line of a bit line pair is connected to an input of a differential sensing amplifier. During a memory read, the voltage level of the output of the sensing amplifier indicates whether a logical one or logical zero is stored in the memory cell.

After a write to the memory cell is complete, the voltage level of the written bit line (the bit line driven low during the write operation) needs to be recovered before the next read or write operation. To decrease the recovery time or propagation delay after a write operation, a recovery circuit can be implemented in each column circuit of the array to recover the bit line pair after a write operation. Typically, these recovery circuits are activated by a global recovery signal which activates all of the recovery circuits in a memory array after a write operation regardless of whether a particular column circuit was involved in a write operation.

One problem with indiscriminately activating the recovery circuits of a memory array is that power is dissipated in activating the recovery circuits of a column circuit not selected for a write operation. With the power consumption and heat dissipation requirements of today's processors, it would be desirable to reduce the power consumed and heat produced by a memory array due to a write operation.

What is needed is a memory array that consumes less power and produces less heat due to a write operation.

SUMMARY OF THE INVENTION

It has been discovered that providing a selective recovery circuit and method for a memory array advantageously allows bit line recovery after a write operation on a selective basis so that only those column circuits actually written are recovered.

In one aspect of the invention, a memory array circuit includes a plurality of column circuits of a first type. Each of the column circuits includes a true bit line and a complement bit line together forming a bit line pair and an associated plurality of memory cells electrically coupled to the bit line pair. Each of the memory cells is selectable for a write operation. Each column circuit also includes a first circuit for generating a recover bit line (RBL) signal after a write operation to a selected memory cell of the associated plurality of memory cells coupled to the bit line pair and a bit line recovery circuit coupled to a written bit line of the bit line pair for recovering the written bit line in response to the RBL signal.

In another aspect, the invention includes a method for recovering a bit line pair in a memory array. The method includes determining whether a memory cell of a plurality of memory cells electrically coupled to the bit line pair has been written and if a memory cell of the plurality of memory cells has been written, initiating recovery of a written bit line of the bit line pair. The method also includes monitoring the written bit line to determine that the written bit line has reached a particular level with respect to being recovered and terminating recovery after determining that the bit line has reached the particular level with respect to being recovered.

In another aspect, the invention includes a memory array circuit including a column circuit. The column circuit includes a true bit line and a complement bit line together forming a bit line pair and an associated plurality of memory cells electrically coupled to the bit line pair. Each of the memory cells is selectable for a write operation. The column circuit also includes means for generating a recover bit line (RBL) signal after a write operation to a selected memory cell of the associated plurality of memory cells coupled to the bit line pair and a bit line recovery circuit for recovering a written bit line of the bit line pair in response to the RBL signal. The column circuit further includes means for monitoring the voltage level of the written bit line to determine that the written bit line has reached a particular level with respect to being recovered. The means for generating terminates the RBL signal in response to the means for monitoring determining that the written bit line has reached a particular level with respect to being recovered.

In another aspect, the invention includes a memory array circuit including a first plurality of column circuits. Each column circuit includes a true bit line and a complement bit line together forming a bit line pair and an associated plurality of memory cells electrically coupled to the bit line pair. Each of the memory cells is selectable for a write operation. Each column circuit also includes a bit line recovery circuit for recovering, when activated, a written bit line of the bit line pair. The memory array also includes means for selecting a second plurality of column circuits from the first plurality of column circuits to write to one of the associated plurality of memory cells of each and only each of the second plurality of column circuits during a write operation. The second plurality is less than the first plurality. The memory array further includes means for activating after the write operation only the bit line recovery circuits of the second plurality of column circuits.

In another aspect, the invention includes an integrated circuit chip including a memory array that includes a plurality of column circuits of a first type. Each of the plurality of column circuits includes a true bit line and a complement bit line together forming a bit line pair and an associated plurality of memory cells electrically coupled to the bit line pair. Each of the memory cells is selectable for a write operation. Each of the plurality of column circuits includes a first circuit for generating a recover bit line (RBL) signal after a write operation to a selected memory cell of the associated plurality of memory cells coupled to the bit line pair. The RBL signal, once initiated, is terminated in response to the voltage level of a written bit line of the bit line pair reaching a particular level with respect to recovery. Each of the plurality of column circuits further includes a bit line recovery circuit coupled to the written bit line of the bit line pair for recovering the written bit line in response to the RBL signal.

Providing each column circuit in a memory array with a circuit that generates a recovery signal to recover a written bit line after a write operation to a memory cell advantageously enables a memory array to recover only those bit lines coupled to memory cells that have actually been written.

Recovering only the bit lines coupled to memory cells that have actually been written reduces the power consumption of an integrated circuit that implements the memory array and consequently reduces the amount of heat produced by the integrated circuit.

Terminating a recovery signal in response to determining that the written bit line has reached a particular level with respect to being recovered advantageously provides a column circuit whose recovery is self timed. Thus, a recovery circuit is activated only for the time needed for recovery.

Recovering the bit lines of only those column circuits actually written advantageously saves power in a memory array that implements a scheme of writing to less than all of the column circuits during a write operation. An instruction or data cache on an X86 compatible processor is typically one such type of memory array.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of the best contemplated mode for carrying out the invention. The description is intended to be illustrative of the invention and should not be taken to be limiting.

Figure 1:
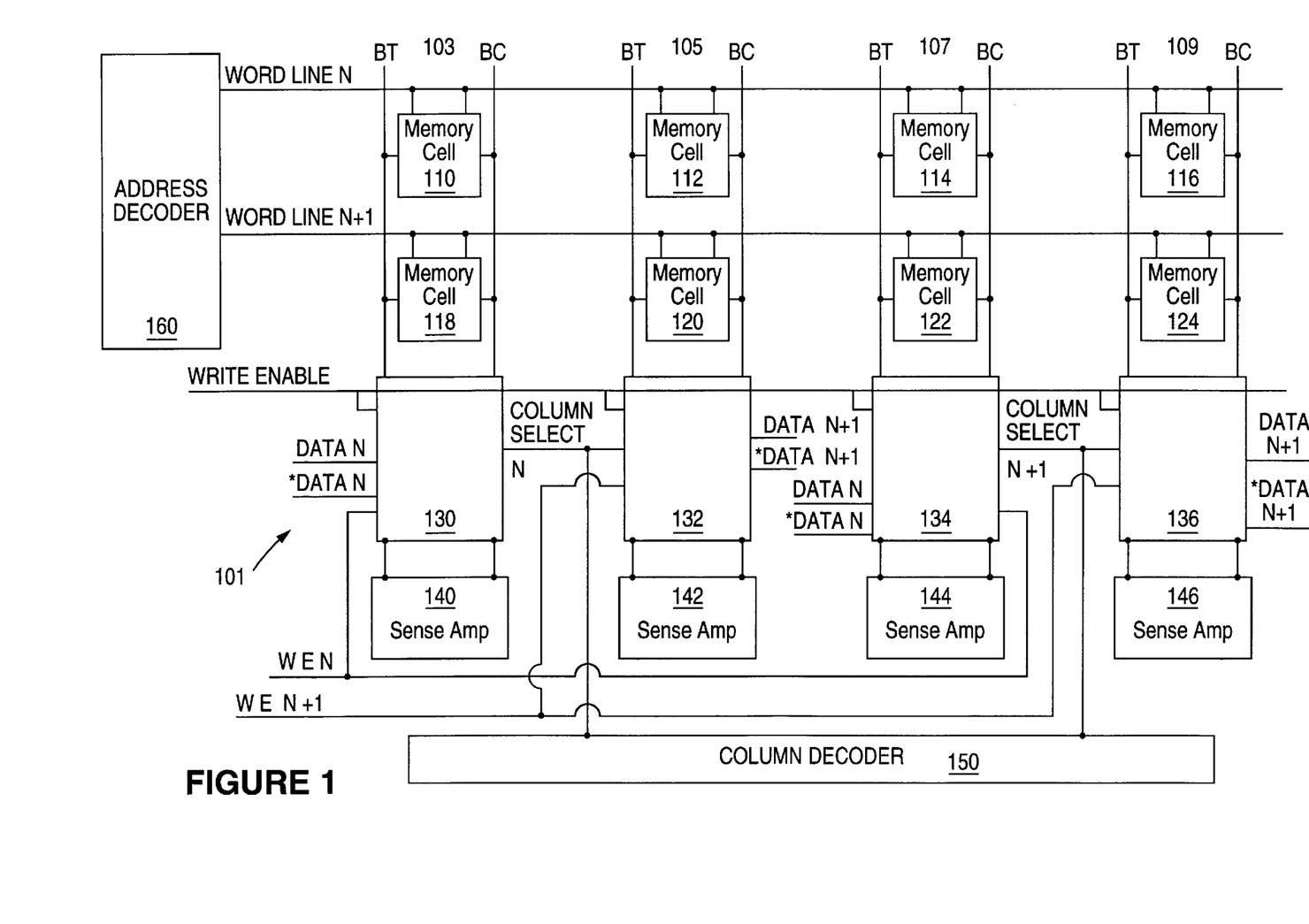
FIG. 1 is a logic diagram of one embodiment of a memory array according to the present invention.

FIG. 1 is a logic diagram of one embodiment of a memory array according to the present invention. In the embodiment shown, memory array 101 includes four column circuits 103, 105, 107, and 109. Each of the column circuits has a bit line pair that includes a true bit line (BT) and a complement bit line (BC). Each column circuit also includes two memory cells (110, 112, 114, 116, 118, 120, 122, and 124) electrically connected to the bit line pair of each column circuit. Each column circuit also includes a sense amplifier (140, 142, 144, and 146) electrically coupled to the bit line pair. These sense amplifiers are used to determine the value stored in a memory cell during a read operation.

In the embodiment shown, memory cells 110, 112, 114, 116, 118, 120, 122, and 124 are six transistor, static random access memory (SRAM) cells, implemented using MOSFETs. However, in other embodiments, other types of memory cells may be used such as four transistor resistive SRAM cells, BiCMOS cells, or DRAM cells. In other embodiments, the present invention may be implemented with memory cell types that are written and read using complementary bit line pairs.

The memory cells of the memory array are organized by rows. Memory cells 110, 112, 114, and 116 make up a first row of memory cells and are electrically connected to word line N, and memory cells 118, 120, 122, and 124 make up a second row of memory cells and are electrically connected to word line N+1. Word lines N and N+1 are each connected to respective outputs of address decoder 160 and are used to select the row of memory cells to be written or read during a memory write or read operation, respectively. In other embodiments, the memory array may include other types of row decode circuitry.

Figure 2:
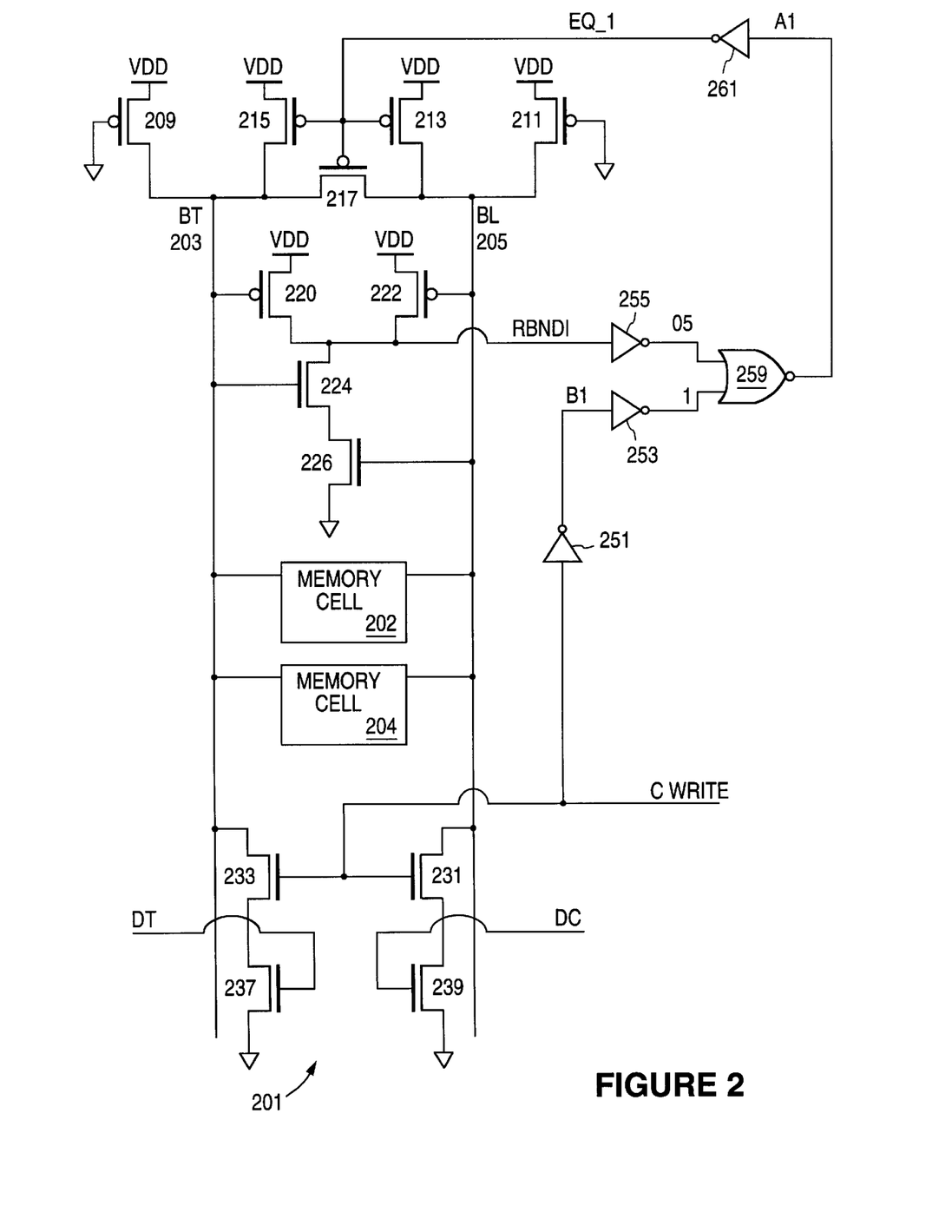
FIG. 2 is a circuit diagram of one embodiment of a column circuit according to the present invention.
Figure 4:
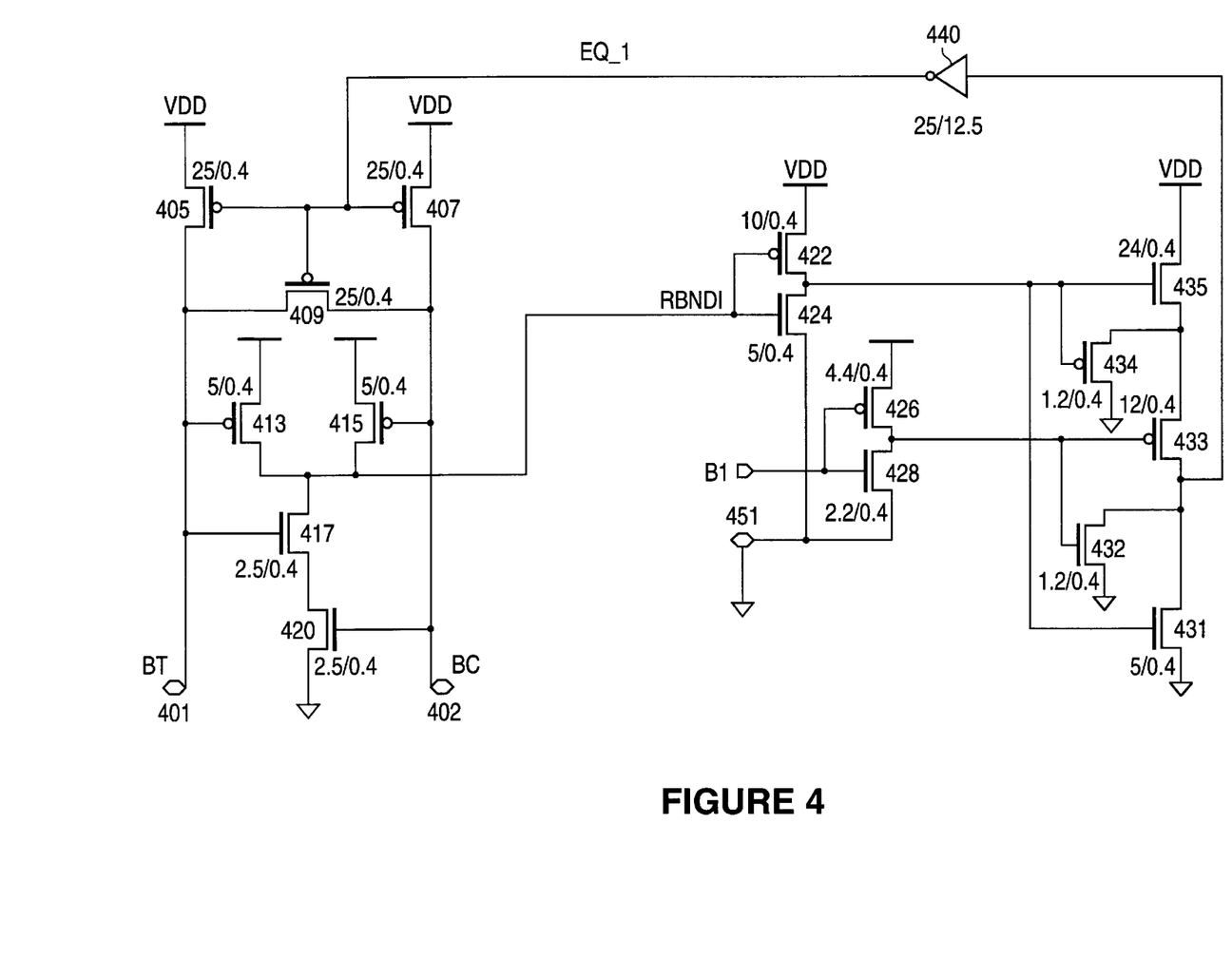
FIG. 4 is a circuit diagram of one embodiment of a column circuit according to the present invention.
Figure 5:
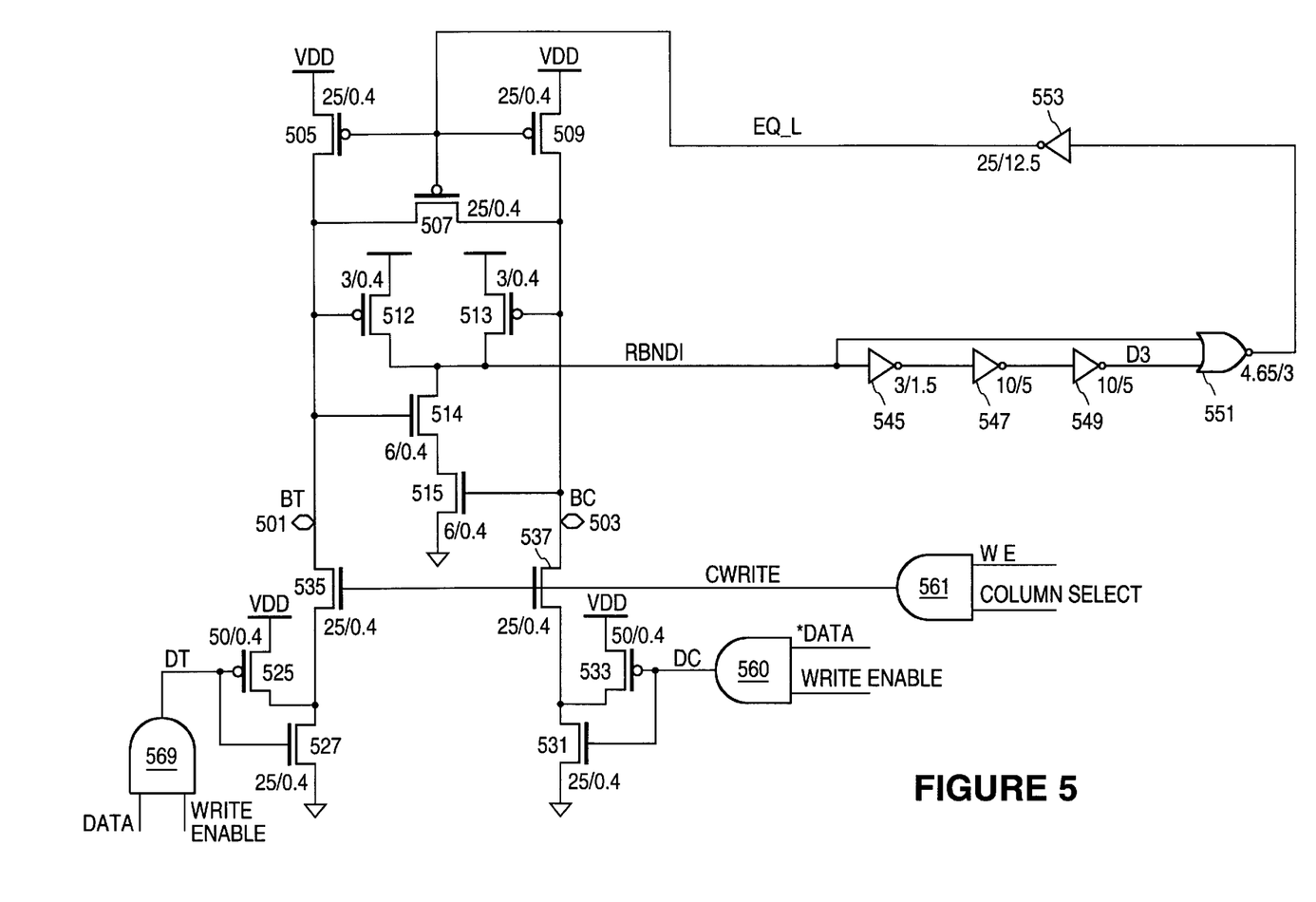
FIG. 5 is a circuit diagram of one embodiment of a column circuit according to the present invention.

Each column circuit 103, 105, 107, and 109 includes write control circuitry and recovery circuitry 130, 132, 134, and 136. Detailed diagrams of different embodiments of this circuitry are shown in FIGS. 2, 4, and 5. Each of the circuitry 130, 132, 134, and 136 receive a global write enable signal, which in the embodiment shown, controls the write operation for the memory array 101. In the embodiment shown, the write enable signal is generated by a memory controller or cache controller (not shown). However, the write enable signal may be provided by other controllers and/or processors electrically coupled to the array. Each of the circuitry 130, 132, 134, and 136 also receives a data signal (DATA) and data complement signal (*DATA), which in the embodiment shown, are provided by the memory controller. However, the data signals may be provided by other circuitry in other embodiments. The data and data complement signals determine the logical value to be stored within a selected memory cell during a write operation.

Each of the circuitry 130, 132, 134, and 136 receives a column select signal provided by a column decoder 150. This column select signal selects the columns of the array that are written or read during a write or read operation, respectively. In the embodiment shown, each column circuit receives a write byte enable (WE) signal. The write byte enable signal is a type of data block enable signal which enables a single byte of a data word or other block of memory selected by a specific column select signal to be written during a write operation. In the embodiment shown, the write byte enable signals are provided by the memory controller, however, in other embodiments, the write byte enable signals may be provided by other controllers or processors.

Column circuits 103 and 105 are selected for a write or read operation by the column select N signal provided by the column decoder 150. Column circuits 107 and 109 are selected for write and read operations by the column select N+1 signal provided by the column decoder 150. Although in the embodiment shown, each column select signal is connected to only two column circuits, in other embodiments, each column select signal may be connected to a different number of column circuits such as, for example, 16, 32, or 64 column circuits. In the embodiment shown, column circuits 103 and 107 each are selected by the write byte enable N signal whereas column circuits 105 and 109 are selected by the write byte enable N+1 signal. In some embodiments, each write byte enable signal is used to select eight column circuits to write a byte of data stored in the memory array. In other embodiments, other types of data block enable signals may be used to individually select a different number of column circuits for a write operation such as two, four, or sixteen column circuits.

In some embodiments, the write byte enable signals and the column select signals can be used in combination to select a particular column circuit or circuits whose associated memory cells are to be written during a write operation. For example, to select column circuit 105, the write byte enable N+1 signal and the column select N signal would be activated. To select the column circuit 109, the write byte enable N+1 signal and the column select N+1 signal would be activated. To write to a specific memory cell, the column circuit coupled to the specific memory cell would be selected and the word line electrically coupled to the specific memory cell would be activated as well. For example, to write to memory cell 120, the WE N+1 signal and the column select N signal would be activated to select column circuit 105 and the word line N+1 signal would be activated to select the row of memory cells containing memory cell 120. Also, to perform a write operation of the memory cell 120, the global write enable signal would be activated and one of the data signals (DATA or *DATA) would also be activated.

In the embodiment shown in FIG. 1, the memory array 101 includes 2 rows, 4 column circuits, and eight memory cells. In other embodiments, the memory array may include a variety of column circuits, rows, and memory cells. For example, the data cache of the K6 processor by ADVANCED MICRO DEVICES, INC. has 32 KB memory cells with 1024 columns circuits and 256 rows.

In other embodiments, the memory array may implement different column decode circuitry or signals other than the write byte enable signals or column select signals, In other embodiments, the memory array may implement a different combination of signals to select a column circuit or circuits for a write operation.

FIG. 2 is a circuit diagram of one embodiment of a column circuit according to the present invention. Column circuit 201 is similar to column circuits 103, 105, 107, and 109 of FIG. 1. Column circuit 201 includes a true bit line (BT) 203 and a complement bit line (BC) 205 which make up a bit line pair. Electrically connected to the bit line pair are static loads 209 and 211, which in the embodiment shown, are enhancement mode, P channel MOSFETs. The sources of MOSFETs 209 and 211 are connected to VDD and the drains are connected to the bit lines. The gates of MOSFETs 209 and 211 are connected to ground.

Memory cells 202 and 204 are electrically connected to the bit line pair. In the embodiment shown, these memory cells are SRAM memory cells, however, in other embodiments, other types of memory cells may be used. Data is written into memory cells 202 and 204 via MOSFETs 233, 231, 237, and 239 which are made conductive by signals that control the writing of the memory cells. In the embodiment shown, these signals are the CWRITE signal, the data true signal (DT), and the data complement (DC) signal. In the embodiment shown, MOSFETs 231, 233, 237, and 239 are N channel, enhancement mode MOSFETs with the gates connected to the control signals and the sources of MOSFETs 237 and 239 connected to ground.

To write to a memory cell in the column circuit 201, the CWRITE signal is driven active high to make transistors 231 and 233 conducting. Depending on whether a logical 1 or a logical 0 is to be written in the memory cell, either the data true (DT) or the data complement (DC) signal is also driven high to make conductive either transistor 237 or 239, respectively. Making either transistor 239 or 237 conductive while CWRITE is active drives the voltage level of one of the bit lines (BC 205 or BT 203) electrically coupled to the conducting transistor (239 or 237) to a low voltage level in order to write to the selected memory cell. Thus, if a logical 0 is to be written into a memory cell of the column circuit, the DC signal is active high during the period when the CWRITE signal active high. This causes the bit line BC 205 to be driven low during the write operation. If a logical 1 is to be written, then the DT signal is active high during the activation of the CWRITE signal causing the true bit line 203 to be driven to a low voltage. Memory cells 202 and 204 are electrically connected to two different word lines which are not shown in FIG. 2. The specific word line that is activated during the activation of the CWRITE signal determines which memory cell (202 or 204) is written during a write operation.

In the embodiment shown, each column circuit of the memory array includes a recovery circuit for recovering a written bit line after a write operation to a memory cell coupled to the bit line. In the embodiment shown, the recovery circuit is an equilibration or equilibrate circuit made up of transistors 215, 217, and 213. This equilibration circuit, when activated, pulls the voltage level of a written bit line (the bit line that has been driven to a low voltage level during a write operation) up towards VDD and equilibrates the bit lines or pulls the voltage levels of each of the bit lines towards each other. When the equilibrate circuit is activated, transistors 215 and 213 are made conductive to electrically couple bit line 203 and bit line 205, respectively, to VDD to pull the voltage levels of the bit lines towards VDD. Also, when the equilibration circuit is activated, transistor 217 is made conductive to electrically couple the bit lines 203 and 205 together to equilibrate the voltage levels of the bit line pair.

In the embodiment shown, the equilibration circuit (transistors 213, 215, and 217) is activated by an active low equilibration signal (EQ_l). The equilibration signal is provided by a logic circuit, which in the embodiment shown, includes a NOR gate 259, inverters 255, 253, 251, and 261 and a NAND gate formed by transistors 220, 222, 224, and 226. EQ_l is provided by the output of inverter 261 which inverts the output of NOR gate 259. One input (D5) of NOR gate 259 is the inverted output (RBNDI) of the NAND gate formed by transistors 220, 222, 224, and 226. Bit lines 203 and 205 are each electrically connected to an input of the NAND gate. The other input of the NOR gate 259 is the CWRITE signal or a signal that is activated and deactivated to control the write operation during a write to a memory cell electrically coupled to the bit line pair 205 and 203.

Figure 3:
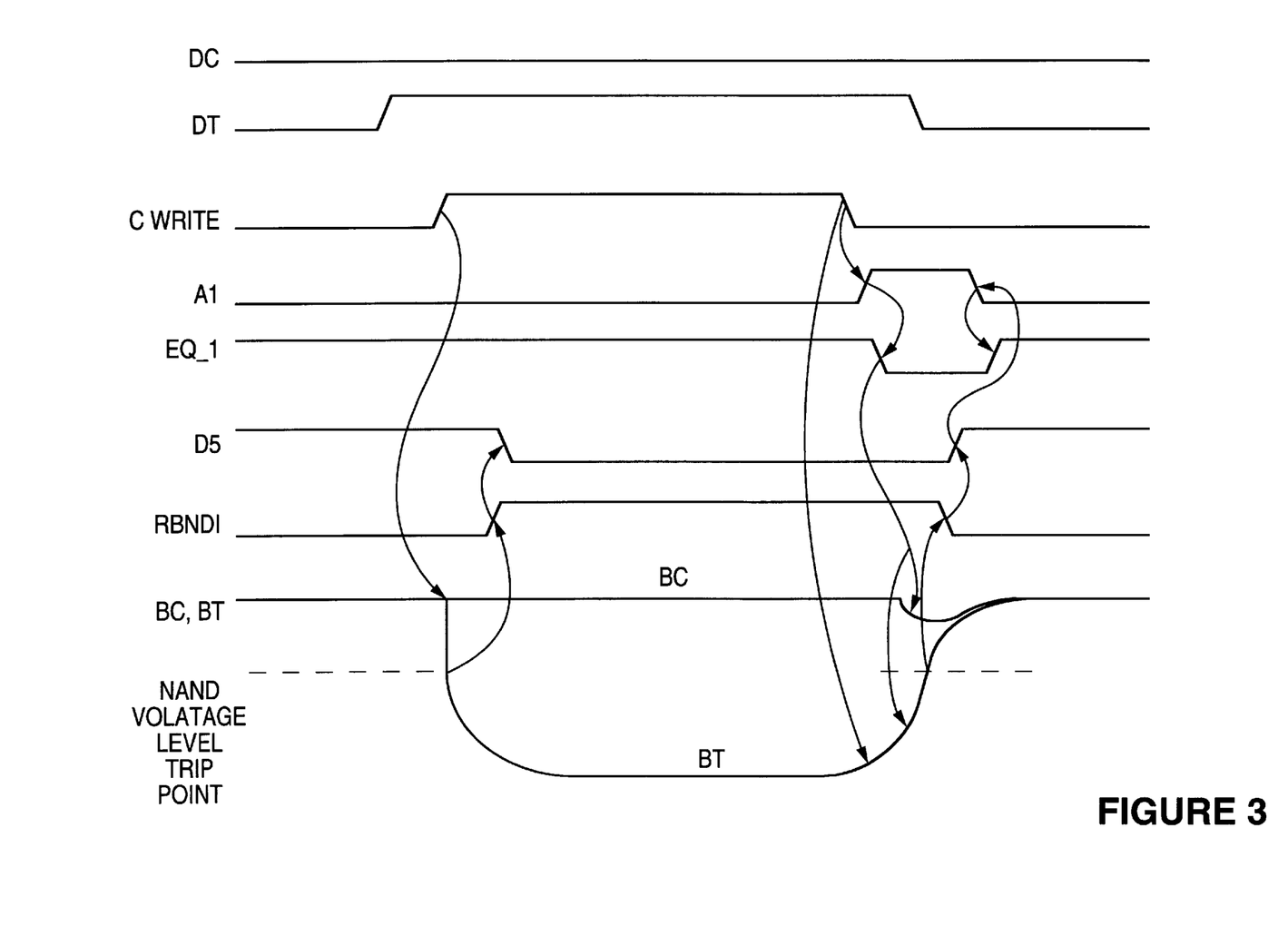
FIG. 3 is a timing diagram according to one embodiment of the present invention.

FIG. 3 is a timing diagram showing of the recovery of a written bit line after a write operation according to the embodiment of the present invention shown in FIG. 2. To initiate a write operation for the column circuit of FIG. 2, the CWRITE signal is driven high while one of the data signals (DT or DC) is driven high to drive the voltage level of either the true bit line 203 or the complement bit line 205 low. In the embodiment shown in FIG. 3, the data true signal (DT) is at a high voltage level during the time that the CWRITE signal goes active to write a logical 1 to a memory cell electrically coupled to the bit line pair.

As the voltage level of the bit line BT goes from VDD towards a low voltage level during a write operation, the voltage level of the bit line BT goes below the trip point level of the NAND gate formed by transistors 220, 222, 224, and 226. At this point, the output of the NAND gate RBNDI transitions from a low voltage to a high voltage, which in turn causes the D5 signal to go to a low voltage. Driving the a voltage level of the BT bit line to a low voltage level causes a logical 1 to be written to either memory cell 202 or 204 depending on which associated word line (not shown in FIG. 2) has been activated. After a specific period of time during which one of the memory cells has been written with a logical 1, the CWRITE signal is deactivated to end the write operation. The deactivation of the CWRITE signal causes the output of NOR gate 259 to go high, which in turn drives the equilibrate (EQ-l) signal to a low voltage level to activate the equilibrate circuit to recover bit line BT.

Activating the equilibration circuit has two effects upon the voltage levels of the bit line pair BC 205 and BT 203. First, activating the equilibrate circuit makes transistor 215 conducting which electrically couples bit line BT to VDD via a low impedance transistor 215. This increases the rate of increase of the voltage level of bit line BT towards VDD. The second result of activating the equilibrate circuit is that it equilibrates the bit line pair by coupling the bit lines BT to BC together via a conducting equilibrate transistor 217. This causes the voltage level of bit line BC to drop towards the voltage level of BT and to pull the voltage level of bit line BT up towards the voltage level of bit line BC to shorten the period of time after a write operation that a voltage differential exists between the bit line pair. Making transistor 217 conductive also aids in pulling up the voltage level of bit line BT by coupling bit line BT to VDD via a second low impedance transistor 213, which is conducting when the equilibration circuit is activated.

Once the voltage level of bit line BT has reached a particular point with respect to recovery, or in the embodiment shown, the NAND trip point voltage level, the output of the NAND gate goes low which indicates that the voltage levels of both bit lines 203 and 205 are above the NAND voltage level trip point. The output (RBNDI) of the NAND gate going low causes an input (D5) of the NOR gate 259 to go high which in turn causes the output A1 of NOR gate 259 to go low. A1 going low causes the output of inverter 261 to go high which deactivates the equilibration circuit, which in the embodiment shown terminates the recovery of the written bit line.

Because the CWRITE signal is NORed with the inverted output D5 of the NAND gate, the equilibrate signal (EQ_l) will be driven active low during a write operation only if one of the bit lines is actually driven to a low voltage during the write operation. Thus, the output of the NAND gate provides an indication that a memory cell coupled to the column circuit has been written during a write operation. Consequently, it is not necessary, in the embodiment shown, that the CWRITE signal be responsive to the column select and byte write enable signals for the equilibration circuit to be activated only when a memory cell coupled to the column circuit is written.

For a memory array whose column circuits are all similar to column circuit 201, only the recovery circuits of those column circuits containing a memory cell that has actually been written during a write operation are activated. Other column circuits of a memory array which are not actually written during the write operation include column circuits not selected by the column decode circuitry (the column select signals), as well as those column circuits selected by column decode circuitry but which correspond to a non-enabled byte of a data word as determined by the byte write enable signals. Only activating the recovery circuits of the written column circuits advantageously reduces the number of switching transistors in a memory array due to a write operation. This advantageously reduces the power consumption and therefore the heat produced by the memory array. Thus, an integrated circuit such as an X86 compatible processor that incorporates such a memory array will use less power and produce less heat and therefore be able to operate at faster clock speeds.

In other embodiments, other equivalent logic circuits may be used to activate the equilibrate signal or other recovery signal to recover a written bit line. For example, in one embodiment, an active low equilibration signal may be produced by a second NAND gate whose inputs are the RBNDI signal and the inverted CWRITE signal.

In the embodiment shown in FIG. 2, the CWRITE signal controls the timing of the write operation to the memory cells coupled to the bit lines 203 and 205. In one embodiment, this CWRITE signal is the AND of the global write enable, the write byte enable and the column select signals. In this embodiment, the data true (DT) signal is responsive to the DATA signal (see FIG. 1) and the data complement (DC) is responsive to the *DATA signal (see FIG. 1). In this embodiment, either the DC signal or the DT signal is at an active voltage level during the entire time that the CWRITE signal is activated. Thus, the CWRITE signal controls when the written bit line is driven low. In other embodiments, the CWRITE may be responsive only to the global write enable signal. In this embodiment, the DT and DC signals are responsive to the write byte enable, the column select signals, and the DATA and *DATA signals, respectively. In this embodiment, the data signals DC and DT would only be activated if the specific column select and the specific write byte enable signals electrically coupled to the column circuit 201 are activated.

In other embodiments, the DC and DT signals are responsive to the write byte enable and the DATA and *DATA signals, respectively, and the CWRITE signal is responsive to the column select and the global write enable signals. In other embodiments, the column circuit may only include transistors 237 and 239 and not transistors 231 and 233 with the DT and DC signals being responsive to the write byte enable, the column select, the global write enable, and the DATA and *DATA signals, respectively. In this embodiment, the CWRITE signal would be generated by an ORing of the DC and DT signals. In other embodiments, the memory array does not implement write byte enable signals. In another embodiment, the drains of transistors 237 and 239 may be connected to the sources of the CWRITE enabled transistors (similar to transistors 233 and 231, respectively) of other column circuits in the memory array. In this embodiment, these other column circuits in the memory array would share the data signal enabled transistors 237 and 239 to reduce the load on the data signals. It is understood that many combinations of the various named and unnamed signals may be implemented in a memory array to selectively drive either bit line to a voltage level needed to write to an associated memory cell during a write operation.

In the embodiment shown in FIG. 2, the recovery signal is initiated in response to the deactivation of the CWRITE signal. Since the deactivation of the CWRITE signal ends the write operation by decoupling the written bit line (either 203 or 205) from ground, initiating the recovery signal in response to the deactivation of CWRITE allows the recovery circuit to be activated just after the end of the write operation. In other embodiments, one the data signals (DT or DC) may be deactivated before the CWRITE signal to end the write operation. In this embodiment, the recovery signal could be initiated in response to the deactivation of the activated data signal.

In other embodiments, the NAND gate trip point level may be adjusted to compensate for the characteristics of the recovery circuit, the speed of the recovery signal generation circuit, and/or the desired level of recovery of a written bit line. In the embodiment shown in FIG. 3, the NAND gate trip point voltage level is set so that equilibration circuit is deactivated just as the bit lines reach VDD. In the embodiment shown, the NAND trip point level is approximately ¾ VDD. Thus, the NAND gate trip point is at a lower voltage level with respect to the desired recovery level in order to compensate for the delay in the signal generation circuit from the time when the voltage level of the bit line reaches the NAND gate trip point level until the output of inverter 261 goes high in response thereof. To achieve a similar result in an equivalent circuit, the trip point may be set at a lower or higher voltage level depending upon the delay in the equivalent circuit from the time that the voltage level of the written bit line reaches the trip point until the time that the recovery signal is terminated. For example, a greater delay in the signal generation circuit requires a lower trip point voltage level in order for the deactivation of the recovery circuit to occur when the voltage level of the bit lines reach VDD. However, in some embodiments, the trip point level may be set at VDD.

In other embodiments, the trip point voltage level may be adjusted depending on the desired level of recovery of the bit line. In the embodiment in FIG. 3, the desired level of recovery is when the voltage levels of both bit lines BC and BT are at VDD. In other embodiments, the desired level of recovery is where the voltage level of BT equals or approximately equals the voltage level of BC such that the column circuit will not generate a false read on a subsequent read cycle. In other embodiments, the desired level of recovery may be where the voltage level of the written bit line is above a particular voltage level where the column circuit will not generate a false write on a subsequent write cycle. In the embodiment shown, such a level is approximately ⅝ VDD.

In some embodiments, each column circuit of a memory array includes a recovery circuit and a circuit for generating the a recovery signal as shown in FIG. 2. However, in other embodiments the memory array may also include a second type of column circuit which includes the recovery circuit but not a recovery signal generation circuit. Thus, the second type of circuit would not have the NAND gate, the NOR gate 259 or inverters 261, 255, 253 and 251, or an equivalent circuit. The recovery circuit of the second type of column circuit would be activated by a recovery signal generated by a recovery signal generation circuit from another column circuit in the array similar to the column circuit of FIG. 2. In other embodiments, a memory array may only include one column circuit as shown in FIG. 2 which would act as a dummy circuit that is written during every memory write and generates a global recovery signal to the rest of the column circuits in the memory array which are of the second type. In this embodiment, the signal that activates each recovery circuit of the second plurality of column circuits would be responsive to the global recovery signal. Furthermore, the recovery signal received by each recovery circuit may be ANDed with the particular write byte enable signal and/or column select signal used to select the respective column circuit so that the recovery circuit of each column circuit of the second type is only activated if that column circuit was involved in the write operation.

In other embodiments, the memory array would include a first plurality of column circuits similar to the one in FIG. 2 wherein the recovery signal produced by the first plurality would also activate the recovery circuits of a second plurality of column circuits which do not include a recovery signal generation circuit. In one embodiment, each column circuit of the first plurality would generate a recovery signal to activate the recovery circuits of seven other column circuits of the second plurality. In this embodiment, if the one column circuit of the first plurality and the seven column circuits of the second plurality are all selected by the same write byte enable signal, then the recovery signal generated by the column circuit of the first plurality would not have to be ANDed with the column select and write byte enable signals that activate the seven column circuits of the second plurality.

In other embodiments, the recovery signal generation circuit may implement other types of circuits for determining when a written bit line has reached a particular level with respect to recovery. In one embodiment, the recovery signal is terminated when the voltage level of the written bit line and the voltage level of the unwritten bit line differ by less than a particular amount after a write operation. For example, the recovery signal generation circuit would include a differential circuit with an output that would transition from a low state to a high state when the voltage levels of the bit line pairs would differ by a particular amount. Referring to FIG. 2, this differential circuit would replace the NAND gate wherein the output of the differential circuit would be inverted and inputted into a NOR gate 259. However, other circuit arrangements may be used to implement a differential determination circuit.

Although the recovery circuit in the embodiment of FIG. 2 is an equilibration circuit that includes to 3 P channel MOSFET transistors, other embodiments may include other types of recovery circuits and/or configurations. For example, in some embodiments, the recovery circuit may not include an equilibration device such as transistor 217. Such a recovery circuit would only pull the written bit line towards VDD when activated and would not equilibrate the bit line pair when activated. In other embodiments, the recovery circuit may include an equilibrate transistor and not include the two pull up transistors similar to transistors 215 and 213.

FIG. 4 is a circuit diagram of one embodiment of a column circuit including a recovery circuit and recovery signal generation circuit according to the present invention. In the embodiment shown in FIG. 4, the recovery circuit is an equilibration circuit is made up of three P channel transistors 405, 407, and 409, which in the embodiment shown, are enhancement mode transistors with a channel width of 25 microns and a channel length of 0.4 microns. Electrically connected to the bit lines 401 and 402 is a NAND gate formed by MOSFETs 413, 415, 417, 420 with transistors 417 and 420 being N channel MOSFETs with a channel width of 2.5 microns and a channel length of 0.4 microns. The output (RBNDI) of the NAND gate is inputted into an inverter formed by transistors 422 and 424. An inverted CWRITE signal B1 is inputted into an inverter formed by the transistors 426 and 428. The CWRITE signal can be generated in any manner as described with respect to FIG. 2. The sources of transistors 424 and 428 are connected to node 451, which in the embodiment is connected to ground. In another embodiment, node 451 is connected to ground via a transistor (not shown) that enables the recovery signal generation circuit to be disabled during testing by decoupling node 451 from ground. For example, see the co-pending, commonly-assigned, concurrently-filed U.S. patent application Ser. No. 08/938,732, entitled "Data Retention Test for Static Memory Cell" and naming Dennis L. Wendell as inventor, which application is incorporated herein by reference in its entirety.

Transistors 435, 434, 433, 432, and 431 form a NOR gate whose output is inputted into inverter 440. The output of inverter 440 produces the recovery signal which activates the recovery circuit. In the embodiment shown, the recovery signal is an active low equilibrate signal (EQ_1). In the embodiment of FIG. 4, the bit line pair 401 and 402 may be connected to static load transistors (not shown) and a sense amplifier (not shown). Also not shown in FIG. 4 are the memory cells which are coupled to the bit line pair. The column circuit of FIG. 4 operates in a similar manner as the column circuit of FIG. 2.

FIG. 5 is a circuit diagram of another embodiment of a column circuit according to the present invention. In this embodiment, the recovery signal is initiated in response to the voltage level of the written bit line reaching a particular voltage level after a write operation. The column circuit shown in FIG. 5 includes bit lines 501 and 503 that make up a bit line pair. Connected to the bit line pair is an equilibration circuit made up of transistors 505, 507 and 509. Transistors 512, 513, 514, and 515 make up a NAND gate whose inputs are electrically connected to the bit line pair. The output (RBNDI) of the NAND gate is inputted directly into one input of NOR gate 551. The output RBNDI is also inputted into a second input D3 of NOR gate 551 via a series of inverters 545, 547, and 549 which act to delay the RBNDI signal. The output of the NOR gate 551 is inputted into inverter 553. The output of inverter 553 provides an active low equilibrate signal (EQ_1) that activates the equilibrate circuit formed by transistors 505, 507 and 509 to recover a written bit line after a write operation.

Connected to the bit lines 501 and 503 are transistors 535 and 537, respectively, which are made conductive by the CWRITE signal. Connected to the sources of transistors 535 and 537 are transistors 527 and 531, respectively. Transistors 527 and 531 are made conductive by active high data true (DT) and data complement (DC) signals, respectively. Transistors 525 and 533 are connected to the sources of transistors 535 and 537, respectively. The gates of transistors 525 and 533 are connected to the DT and DC signals, respectively.

The DT signal is responsive to both the data (DATA) signal and the global write enable signal via AND gate 569. The DC signal is responsive to both the data complement signal (*DATA) and the global write enable signal via AND gate 560. In the embodiment shown, the CWRITE signal is generated by AND gate 561 and is responsive to both a write byte enable signal (WE) and a column select signal. In the embodiment shown, the global write enable signal is generated by the memory controller (not shown) and controls the timing of the write operation. Because the data signals DT and DC are responsive to the write enable signal, in the embodiment shown, the DT and DC signals will be deactivated prior to the CWRITE signal during the write operation.

The column circuit in FIG. 5 is selected for a write operation via the CWRITE signal which is activated by activating both the WE and Column select signals. Either Bit line 501 or bit line 503 is driven to a low voltage to write to a selected memory cell (not shown) coupled to the bit line pair. If the data true (DT) signal is activated, then bit line BT 501 is driven to a low voltage to store a logical 1 in the selected memory cell. If the data complement (DC) signal is activated, then bit line BC 503 is driven to a low voltage to store a logical 0 in the selected memory cell.

After a predetermined period of time in which the selected memory cell is written, the global write enable signal goes inactive or low which causes either the DC or DT signal to go low, depending on which signal was previously active. At this time the CWRITE signal is still active high. If the DC signal was the data signal that was previously active during the write operation, then the DC signal going low causes transistor 533 to become conducting, which in turn couples bit line 503 to VDD via transistor 533 and transistor 537 to begin recovery of the written bit line 503 by pulling the voltage level of bit line 503 towards VDD. Also, the DC signal going low decouples bit line 503 from the ground by making transistor 531 non conductive. As the voltage level of bit line 503 reaches the level of the trip point of the NAND circuit formed by transistors 512, 513, 514, and 515, the output RBNDI transitions to a low voltage level which causes the output of NOR gate 551 to transition to a high voltage level. The output of NOR gate 551 going high causes the output (EQ-l) of the inverter 553 to transition to a low voltage to activate the equilibration circuit. Because the other input (D3) of NOR gate 551 is connected through a series of inverters 545, 547, and 549 to the output (RBNDI) of the NAND circuit, the output of the NOR gate 551 transitions to a low voltage a period of time after the output of the NOR gate 551 has transitioned to the high voltage to activate the equilibrate signal. The length of this period of time depends upon the delay added by the inverters 545, 547, and 549. Consequently, the length of time that the equilibration signal (EQ_1) is active is dependent upon the amount of time that the RBNDI signal is delayed by inverters 545, 547, and 549. The delay should be longer than the worst case recovery time of a written bit line.

During the recovery of a written bit line (either 501 or 503) after a write operation, the CWRITE signal must remain at a high voltage level for at least until the voltage level of the written bit line exceeds the trip point of the NAND gate formed by transistors 512, 513, 514, and 515. Because the equilibration signal is initiating in response to the transitioning of the output of the NAND gate formed by transistors 512, 513, 514, and 515, the trip point of the NAND gate of FIG. 5 is at a relatively lower level than the trip point of the NAND gate of FIGS. 2 and 4. In one embodiment, the trip point level of the NAND gate of FIG. 5 is approximately ⅓ VDD.

One advantage of the circuit of FIG. 5 is that the physical location on the column circuit of the NAND gate, the NOR gate 551, and the recovery circuit is not dependent upon the physical location of the CWRITE and data signal enabled transistors 535, 537, 527, and 531.

In another embodiment, the CWRITE signal of FIG. 5 would be responsive to the write enable signal and would be connected to the gates of transistors 525, 527, 531, and 533. In this alternative embodiment, the DT signal would be connected to the gate of transistor 535 and the DC signal would be connected to the gate of transistor 537. Also in this alternative embodiment, the DC and DT signals would not be responsive to the global write enable signal.

Although the invention as shown in FIGS. 2, 4, and 5 are implemented with MOSFETs, the inventions may be implemented with other types of electronic devices such as bi-polar transistors.

In some embodiments, the circuits of FIGS. 2, 4, and 5 are implemented on the integrated circuit semiconductor chips.

In some embodiments, the circuit of FIGS. 2, 4, and 5 are implemented in a memory array in a data and/or instruction cache of a microprocessor such as the K6 microprocessor by ADVANCED MICRO DEVICES, INC. or other types of X86 compatible processors.

Processor and System Embodiments

Figure 6:
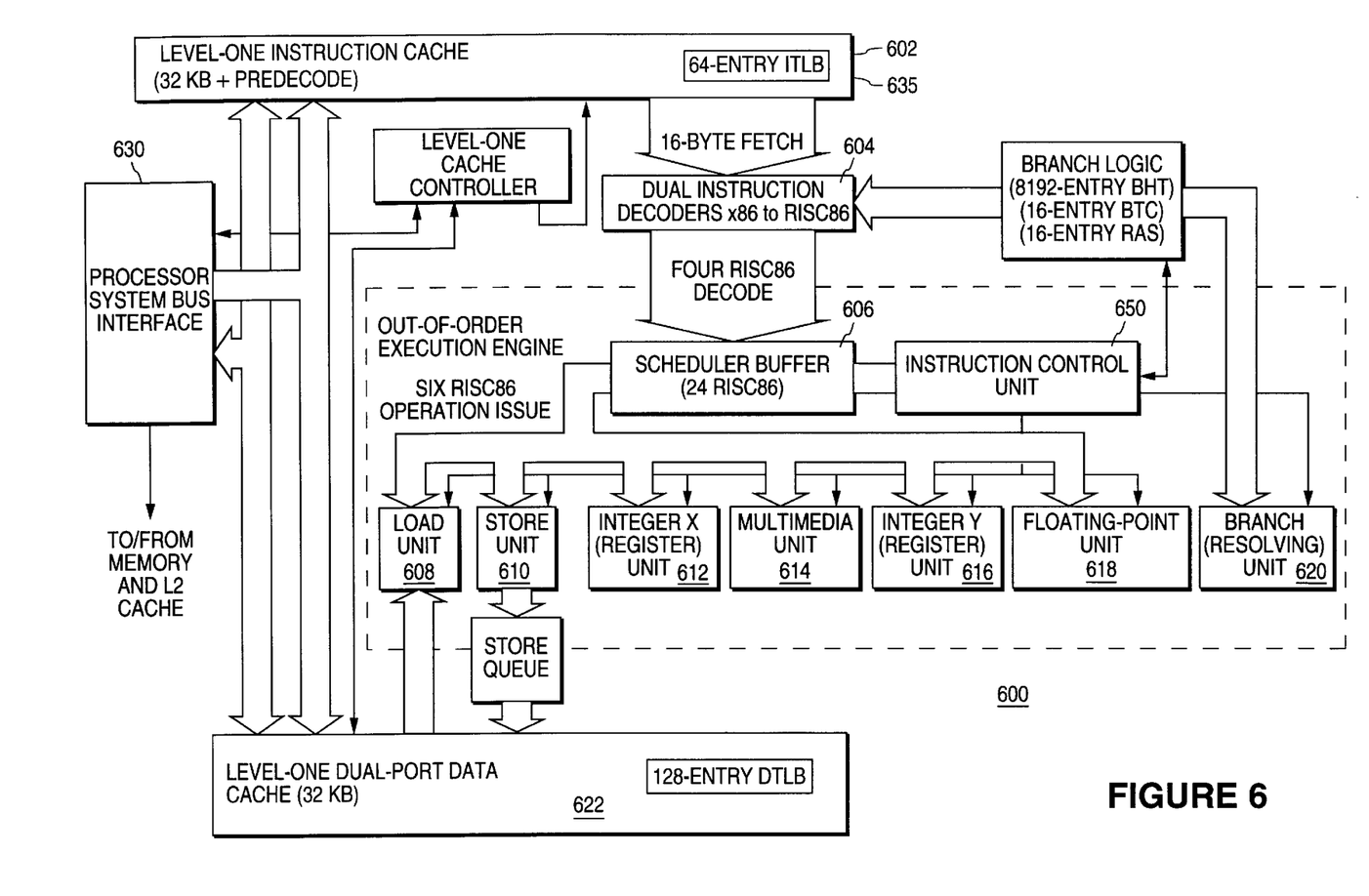
FIG. 6 is a logic diagram of one embodiment of a processor according to the present invention.

The selective bit line recovery circuit and method of the present invention can be used in variety of circuits and devices incorporating semiconductor memory. For example, FIG. 6 depicts an exemplary x86 instruction-set compatible integrated circuit microprocessor 600 such as the K6 microprocessor by ADVANCED MICRO DEVICES, INC. Instructions obtained from a processor system bus interface 630 are pre-decoded during filling of a level-one (L1) instruction cache 602 after which the predecode bits are stored in a predecode cache 635. Integrated circuit microprocessor 600 decodes up to two x86 instructions per clock from instruction cache 602. Most of the x86 instructions are directly translated by hardware of dual instruction decoders 604 into one to four RISC-like operations, called RISC86 Ops. Other complex or uncommon instructions are mapped into ROM-resident sequences of RISC Ops using emulation code ROM translation. An instruction scheduler 606 buffers up to 24 RISC86 operations, using register renaming with a total of 48 registers. Up to six RISC86 instructions are issued out-of-order to seven parallel execution units, illustratively load unit 608, store unit 610, integer X unit 612, multimedia unit 614, integer Y unit 616, floating point unit 618, and branch unit 620. RISC86 instructions are speculatively executed and retired in order. Microprocessor 600 also includes level-one (L1) dual-port data cache 622.

Data, instruction and predecode cache sizes are 32 KB, 32 KB and 20 KB, respectively, constructed from macro building blocks of 8 KB and 10 KB. Time multiplexing allows 1 read and 1 write per cycle. A 4×64 bit write eviction buffer is included in each data cache macro. The predecode macro includes the first stage of instruction decode logic. Bypass and storage buffer for data, instruction and predecode are provided of size 4×16, 4×16 and 2×40 bits, respectively, allowing data-in to flow back to the cache outputs.

In the embodiment of FIG. 6, both instruction cache 602 and data cache 622 exhibit the following basic features: 32 KB size; 2-way set associativity; 64-byte line size with 32-byte sub-blocking; cache fills on a subblock basis; virtual indexing (only bits [13:12] of the index address are virtual) and physical tagging. Synonyms/aliasing are handled in hardware; hit under miss is supported, and mutual exclusion as between instruction cache 602 and data cache 622 is supported. This eases the handling of self modifying code. To clarify the terminology: There are 256 sets in each cache. Each set contains two-ways (or lines) and each line contains two sub-blocks. The result is a 256×2'64, or 32 KB cache.

A level-one cache controller 640 controls caching in instruction cache 602. Instruction cache 602 uses a most recently used scheme (MRU) to predict the way selection on cache accesses. A misprediction in the way selection causes a one cycle penalty. Instruction cache 602 uses a least recently used (LRU) line replacement algorithm. An alternative random replacement algorithm is supported through a configuration bit. Instruction cache 602 also supports a direct-mapped replacement algorithm, although using the configuration reduces the cache size from 32 KB to 16 KB. Instruction cache 602 performs a simple prefetching algorithm. When a line miss occurs, as distinguished from a sub-block miss, and the miss is on sub-block 0 of the line (bit [5] of the address is 0), then both sub-blocks are fetched and pipelined on the bus.

The data cache 622 includes a 128-entry data translation lookahead buffer (DTLB). In contrast to instruction cache 602, the data cache 622 uses a least recently missed (LRM) selection technique which is generally a more accurate selection scheme than the LRU technique. In the LRM scheme, the line that first enters the cache is replaced. An alternative random replacement algorithm is also supported. The data cache 622 also supports a direct-mapped replacement algorithm, reducing the cache size from 32 KB to 16 KB.

The RISC86 Op scheduler 606, under control of an instruction control unit 650, issues up to six RISC86 operations using out-of-order issuing to seven parallel execution units. The execution units speculatively execute the RISC86 Ops to generate results. The RISC86 Op scheduler 606 retires the results in order. Branch unit 620 implements a branch prediction operation that uses two-level branch prediction based on an 8192-entry branch history table (BHT), a 16-entry branch target cache (BTC), and a 16-entry return address stack (RAS).

The dual instruction decoders 604 translate x86 instructions on-the-fly into corresponding RISC86 Ops. The RISC86 Ops are executed by an instruction core that is essentially a RISC superscalar processing or execution engine. The fetch logic fetches up to sixteen instruction bytes each cycle from instruction cache 602 and transfers the instruction bytes into an instruction buffer (not shown) preceding the dual instruction decoders 604 so that the instruction buffer is maintained at capacity. The dual instruction decoders 604 access the instruction bytes from the instruction buffer, decode up to two x86 instructions, immediately recognize and predict branches, and generate up to four RISC86 Ops. The RISC86 Ops are loaded into the unified RISC86 Op scheduler 606. The RISC86 Op scheduler 606 controls and tracks multiple aspects of RISC86 Op issue and execution.

The load unit 608 loads data via data cache 622 which receives data from an external memory (not shown) via the processor system bus interface 630. Bypass (not shown) and storage buffers (not shown) for data (4×16) to the data cache 622 are supplied to allow data-in and data flow-back to cache output terminals.

In one embodiment, the column circuits of the data cache 622, the instruction cache 602, and the precode cache 635, each include a recovery circuit and a recovery signal generation circuit similar to that shown in FIG. 4.

An exemplary microprocessor may be found in U.S. Provisional Application Ser. No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which is incorporated herein by reference in its entirety.

A wide variety of computer system configurations are envisioned, each embodying the above-described selective bit line recovery circuit and method in accordance with the present invention. For example, one such a computer system includes integrated circuit microprocessor 600 with instruction, data and predecode caches having selective bit line recovery in accordance with the present invention, a memory subsystem (e.g., RAM), a display adapter, disk controller/adapter, various input/output interfaces and adapters, and corresponding external devices. Memory, adapters and interfaces are conventionally coupled to integrated circuit microprocessor 600 (e.g., via busses).

While particular embodiments of the present invention have been shown and described, it will be obvious to those skilled in the art that changes and modifications may be made without departing from this invention and its broader aspects and, therefore, the appended claims are to encompass within their scope all such changes and modifications as are within the true spirit and scope of this invention.

General Nomenclature and Terminology Usage

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "circuit 10 pulls the OUT signal high" and "circuit 10 drives OUT high." Such shorthand phrases for describing circuit operation are just as clear and much easier to quickly communicate details of circuit operation without becoming lost in needless prepositional phrases, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high" and "drive high" are generally synonymous unless otherwise distinguished, as are the phrases "pull low" and "drive low." It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "de-activated" when driven to the inactive level.

Regarding power supplies, a single positive power supply voltage (e.g., a 3.3 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor (unless otherwise defined) means the same as being "pulled low" or "pulled to ground" by the transistor or "pulled to ground via the conductive transistor".

Generalizing somewhat, the first power supply terminal is frequently named "VDD", and the second power supply terminal is frequently named "VSS." Both terms may appear either using subscripts (e.g., $V_{DD}$) or not. Historically the nomenclature "$V_{DD}$" implied a DC voltage connected to the drain terminal of a MOS transistor and $V_{SS}$ implied a DC voltage connected to the source terminal of a MOS transistor. For example, old PMOS circuits used a negative VDD power supply, while old NMOS circuits used a positive VDD power supply. Common usage, however, frequently ignores this legacy and uses VDD for the more positive supply voltage and VSS for the more negative (or ground) supply voltage unless, of course, defined otherwise. Describing a circuit as functioning with a "VDD supply" and "ground" does not necessarily mean the circuit cannot function using other power supply potentials. Other common power supply terminal names are "VCC' (a historical term from bipolar circuits and frequently synonymous with a +5 volt power supply voltage, even when used with MOS transistors lacking collector terminals) and "GND" or just "ground.

An insulated gate field effect transistor (IGFET) transistor may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is frequently symmetrical. For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". Such a description is equally valid for a P-channel IGFET transistor, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable.

It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOSFET should not be interpreted to literally specify a metal gate FET having an oxide dielectric.

What is claimed is:

1. A memory array circuit including a plurality of column circuits of a first type each comprising:
    a true bit line and a complement bit line together forming a bit line pair;
    an associated plurality of memory cells electrically coupled to the bit line pair, each of the memory cells being selectable for a write operation;
    a first circuit for generating a recover bit line (RBL) signal after a write operation to a selected memory cell of the associated plurality of memory cells coupled to the bit line pair; and
    a bit line recovery circuit coupled to a written bit line of the bit line pair for recovering the written bit line in response to the RBL signal.

2. A circuit as recited in claim 1 wherein the bit line recovery circuit equilibrates the bit line pair in response to the RBL signal.

3. A circuit as recited in claim 1 wherein the RBL signal, once initiated, is terminated in response to the voltage level of the written bit line of the bit line pair reaching a particular level with respect to recovery.

4. A circuit as recited in claim 1 wherein the RBL signal, once initiated, is terminated by the first circuit when the respective voltage levels of the true and complement bit lines both exceed a particular voltage level.

5. A circuit as recited in claim 1 wherein the RBL signal, once initiated, is terminated by the first circuit after a predetermined period of time from when the respective voltage levels of the true and complement bit lines both exceed a particular voltage level.

6. A circuit as recited in claim 1 wherein the RBL signal is terminated by the first circuit when the respective voltage levels of the true and complement bit lines differ by less than a particular amount.

7. A circuit as recited in claim 1 further comprising:
    a logic circuit having a first input electrically connected to the true bit line, a second input electrically connected to the complement bit line, and an output having a first state during a write operation to a selected memory cell of the associated plurality of memory cells coupled to the bit line pair;
    wherein the first circuit terminates the RBL signal in response to the output of the logic circuit transitioning from the first state.

8. A circuit as recited in claim 7 wherein:
    the first circuit initiates the RBL signal in response to the deactivation of a signal, wherein the deactivation of the signal ends a write operation to a selected memory cell, and in response to the output of the logic circuit being in the first state.

9. A circuit as recited in claim 7 wherein:
    the logic circuit includes a NAND circuit.

10. A circuit as recited in claim 1 further comprising:
    a logic circuit having a first input electrically connected to the true bit line, a second input electrically connected to the complement bit line, and an output having a first state during a write operation to a selected memory cell of the associated plurality of memory cells coupled to the bit line pair;
    wherein the first circuit initiates the RBL signal in response to the output of the logic circuit transitioning from the first state.

11. A circuit as recited in claim 1 wherein:
    the first circuit initiates the RBL signal in response to the deactivation of a signal, wherein the deactivation of the signal ends a write operation to a selected memory cell.

12. A circuit as recited in claim 11 wherein the signal is responsive to a column select signal.

13. A circuit as recited in claim 11 wherein the signal is responsive to a data block enable signal.

14. A circuit as recited in claim 11 wherein the signal is responsive to a global write enable signal.

15. A circuit as recited in claim 11 wherein the signal is responsive to a data signal, the data signal determining a logical value stored in a selected memory cell during a write operation.

16. A circuit as recited in claim 1 wherein:
    the first circuit initiating the RBL signal in response to the deactivation of a signal, wherein the deactivation of the signal ends a write operation to a selected memory cell, and in response to an indication signal indicating that a memory cell of the associated plurality of memory cells has been written, the indication signal responsive to the voltage levels of the true and complement bit lines.

17. A circuit as recited in claim 1 wherein the first circuit further includes:
    a logic circuit having an input responsive to an indication signal, the indication signal having a first state indicating that the voltage levels of the true and complement bit lines are above a threshold voltage level and a second state indicating that the voltage level of one of the bit lines is below a threshold voltage level, the indication signal being in the second state during a write operation to a selected memory cell of the associated plurality of memory cells, the logic circuit having a second input responsive to a signal, wherein deactivation of the signal ends a write operation to a selected memory cell, the logic circuit having an output, the output providing the RBL signal;
    wherein the logic circuit initiating the RBL signal in response to the deactivation of the signal and in response to the indication signal being in the second state.

18. A circuit as recited in claim 17 wherein the first circuit terminates the RBL signal in response to the indication signal transitioning from the second state to the first state.

19. A circuit as recited in claim 1 wherein:
    the first circuit initiating the RBL signal in response to the deactivation of a data signal, the data signal determining a logical value stored in a selected memory cell of the associated plurality during a write operation.

20. A circuit as recited in claim 1 wherein:
    the associated plurality of memory cells are Static Random Access Memory cells.

21. A circuit as recited in claim 1 further comprising a second plurality of column circuits, each column circuit of the second plurality comprising:
    true bit line and a complement bit line together forming a bit line pair;
    an associated plurality of memory cells electrically coupled to the bit line pair, each of the memory cells being selectable for a write operation;
    a bit line recovery circuit coupled to the bit line pair for recovering a written bit line of the bit line pair in response to the RBL signal;
    wherein the recovery circuit of the second plurality of column circuits is activated to perform recovery of its bit line pair in response to an RBL signal provided by a first circuit of the first plurality of column circuits.

22. A circuit as recited in claim 1 wherein the first circuit is implemented with MOSFETs.

23. A circuit as recited in claim 1 wherein:

the written bit line is at a low voltage during a write operation of a selected memory cell of the associated plurality;

the bit line recovery circuit pulls the voltage level of the written bit towards a higher voltage in response to the RBL signal.

24. A circuit as recited in claim 1 wherein all of the column circuits of the memory array circuit are of the first type.

25. A method for recovering a written bit line in a memory array comprising:

determining whether a memory cell of a plurality of memory cells electrically coupled to a bit line pair has been written;

if a memory cell of the plurality of memory cells has been written, initiating recovery of a written bit line of the bit line pair;

monitoring the written bit line to determine that the written bit line has reached a particular level with respect to being recovered; and terminating recovery after determining that the bit line has reached the particular level with respect to being recovered.

26. The method of claim 25 wherein:

the initiation of recovery includes initiating a recover bit line (RBL) signal to a recovery circuit coupled to the written bit line;

the termination of recovery includes terminating the RBL signal.

27. The method of claim 26 wherein the recovery circuit equilibrates the bit line pair.

28. The method of claim 25 wherein:

the recovery of the written bit line is initiated in response to an indication that a memory cell of the plurality has been written.

29. The method claim 25 wherein:

the monitoring the written bit line includes determining that the voltage levels of both bit lines of the bit line pair exceed a particular voltage level.

30. The method of claim 29 wherein:

the termination of recovery includes terminating recovery after determining that the voltage levels of both bit lines of the bit line pair exceed a particular voltage.

31. The method of claim 30 wherein:

the termination of recovery includes terminating recovery a predetermined period of time after determining that the voltage levels of both bit lines of the bit line pair exceed a particular voltage.

32. The method claim 25 wherein:

the monitoring the written bit line includes determining that the voltage levels of both bit lines differ by less than a particular amount.

33. The method of claim 25 further comprising:

deactivating a signal to end a write operation a memory cell of the plurality;

wherein the initiation of recovery is initiated in response to the deactivation of the signal.

34. The method of claim 33 further wherein:

during a write operation to a memory cell of the plurality, the voltage level of the written bit line is driven to a low voltage;

wherein the initiation of recovery is initiated only after a determination that the voltage level of the written bit line is below a particular voltage level indicating that a memory cell of the plurality of memory cells has been written.

35. The method of claim 25 wherein:

the initiation of recovery is initiated after deactivation of a data signal, the data signal determining a logical value stored in the memory cell.

36. A memory array circuit including a column circuit, the column circuit comprising:

a true bit line and a complement bit line together forming a bit line pair;

an associated plurality of memory cells electrically coupled to the bit line pair, each of the memory cells being selectable for a write operation;

means for generating a recover bit line (RBL) signal after a write operation to a selected memory cell of the associated plurality of memory cells coupled to the bit line pair;

a bit line recovery circuit for recovering a written bit line of the bit line pair in response to the RBL signal;

means for monitoring the voltage level of the written bit line to determine that the written bit line has reached a particular level with respect to being recovered;

wherein the means for generating terminating the RBL signal in response to the means for monitoring determining that the written bit line has reached a particular level with respect to being recovered.

37. A circuit as recited in claim 36 wherein the means for generating initiates the RBL signal in response to the deactivation of a signal, wherein the deactivation of the signal ends a write operation to a selected memory cell of the associated plurality.

38. A circuit as recited in claim 36 wherein the means for generating initiates the RBL signal in response to an indication that a memory cell of the associated plurality has been written.

39. A circuit as recited in claim 36 wherein the column circuit is a dummy circuit.

40. A circuit as recited in claim 36 including a second column circuit comprising:

a true bit line and a complement bit line together forming a bit line pair;

an associated plurality of memory cells electrically coupled to the bit line pair, each of the memory cells being selectable for a write operation;

a bit line recovery circuit coupled to the a written bit line of the bit line pair for recovering the written bit line in response to the RBL signal of the first column circuit.

41. A circuit as recited in claim 40 including a plurality of second column circuits wherein each of the bit line recovery circuits of the plurality of second column circuits recovers its respective written bit line in response to an RBL signal of the first column circuit.

42. A circuit as recited in claim 36 wherein the bit line recovery circuit equilibrates the bit line pair in response to the RBL signal.

43. A circuit as recited in claim 36 wherein the means for monitoring monitors the voltage level of the true bit line and the complement bit line to determine that both the true bit line and the complement bit line are at least at a particular level with respect to being recovered and for providing an indication signal indicative thereof.

44. A memory array circuit comprising:
a first plurality of column circuits, each column circuit including:
a true bit line and a complement bit line together forming a bit line pair;
an associated plurality of memory cells electrically coupled to the bit line pair, each of the memory cells being selectable for a write operation;
a bit line recovery circuit for recovering, when activated, a written bit line of the bit line pair;
means for selecting a second plurality of column circuits from the first plurality of column circuits to write to one of the associated plurality of memory cells of each and only each of the second plurality of column circuits during a write operation, wherein the second plurality is less than the first plurality; and
means for activating after the write operation only the bit line recovery circuits of the second plurality of column circuits.

45. A circuit as recited in claim 44 wherein the memory array is implemented in a cache of a X86 compatible processor.

46. An integrated circuit chip comprising:
a memory array including a plurality of column circuits, each of the plurality of column circuits comprising:
a true bit line and a complement bit line together forming a bit line pair;
an associated plurality of memory cells electrically coupled to the bit line pair, each of the memory cells being selectable for a write operation;
a first circuit for generating a recover bit line (RBL) signal after a write operation to a selected memory cell of the associated plurality of memory cells coupled to the bit line pair, wherein the RBL signal, once initiated, is terminated in response to the voltage level of a written bit line of the bit line pair reaching a particular level with respect to recovery; and
a bit line recovery circuit coupled to the written bit line of the bit line pair for recovering the written bit line in response to the RBL signal.

47. An integrated circuit chip as recited in claim 46 wherein the integrated circuit chip comprises an integrated circuit microprocessor chip with a cache memory block including the memory array.

48. An integrated circuit chip as recited in claim 46 wherein the integrated circuit chip comprises a memory block including the memory array.

49. An integrated circuit chip as recited in claim 46, coupled into a computer system having a processor, a memory, and a bus coupled therebetween, said integrated circuit chip including circuits of at least one of the processor and the memory.

* * * * *